US010351228B2

(12) United States Patent
Hartmann et al.

(10) Patent No.: US 10,351,228 B2
(45) Date of Patent: Jul. 16, 2019

(54) ROTOR HEAD WITH INTEGRATED ELECTRONICS FOR A HELICOPTER

(71) Applicant: ZF Friedrichshafen AG, Friedrichshafen (DE)

(72) Inventors: Steffen Hartmann, Kassel (DE); Thomas Auspitzer, Kassel (DE); Daniel Fürst, Kassel (DE); Jürgen Götte, Vellmar (DE); Carsten Wintjen, Grebenstein (DE); Andre Hausberg, Kassel (DE); Eckart Hoene, Berlin (DE); Oleg Zeiter, Berlin (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 388 days.

(21) Appl. No.: 15/374,009

(22) Filed: Dec. 9, 2016

(65) Prior Publication Data
US 2017/0166303 A1 Jun. 15, 2017

(30) Foreign Application Priority Data
Dec. 14, 2015 (DE) ........................ 10 2015 225 098

(51) Int. Cl.
*B64C 27/32* (2006.01)
*B64C 11/44* (2006.01)
*H05K 5/03* (2006.01)
*H05K 9/00* (2006.01)

(52) U.S. Cl.
CPC ............... *B64C 27/32* (2013.01); *H05K 5/03* (2013.01); *H05K 9/0007* (2013.01)

(58) Field of Classification Search
CPC ......... B64C 27/32; B64C 11/44; B64C 27/68; H05K 5/03; H05K 9/0007
See application file for complete search history.

(56) References Cited

U.S. PATENT DOCUMENTS

| 3,056,456 | A |   | 10/1962 | Michel et al. |
| 3,217,811 | A |   | 11/1965 | Hibyan et al. |
| 4,212,588 | A | * | 7/1980 | Fradenburgh ............ B64C 7/00 244/17.27 |
| 4,596,513 | A | * | 6/1986 | Carlson ................. B64C 27/001 416/145 |
| 4,695,340 | A | * | 9/1987 | Matuska ............... B29C 53/564 156/161 |

(Continued)

FOREIGN PATENT DOCUMENTS

GB 2090214 A 7/1982
WO WO2005100154 A1 10/2005

OTHER PUBLICATIONS

German Search Report dated Oct. 5, 2016 for DE 10 2015 225 098.9 (German language, 7 pages).

(Continued)

*Primary Examiner* — Jacob M Amick
(74) *Attorney, Agent, or Firm* — Brinks Gilson & Lione

(57) ABSTRACT

The discovery concerns a rotor hub cover for a helicopter, whereby the rotor hub cover has been constructed as a rotational body with a dome-shaped cover and the rotor hub cover has performance and control electronic components, characterized by the arrangement of the performance electronic components and the control electronic components on a surface of the internal side or the dome-shaped cover.

20 Claims, 10 Drawing Sheets

(56) References Cited

U.S. PATENT DOCUMENTS

| | | |
|---|---|---|
| 5,156,527 A | 10/1992 | Pancotti |
| 7,510,377 B1 | 3/2009 | Carter, Jr. et al. |
| 2015/0232174 A1 | 4/2015 | Jolly et al. |

OTHER PUBLICATIONS

English translation of p. 7 of German Office Action dated Oct. 5, 2016 for German Patent Application No. DE 10 2015 225 098.9 (2 pages).

\* cited by examiner

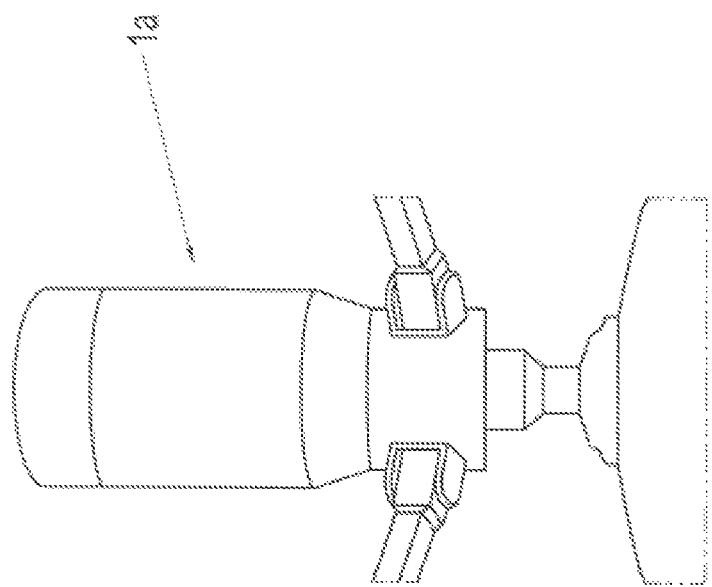
Fig. 1  State-of-the Technology

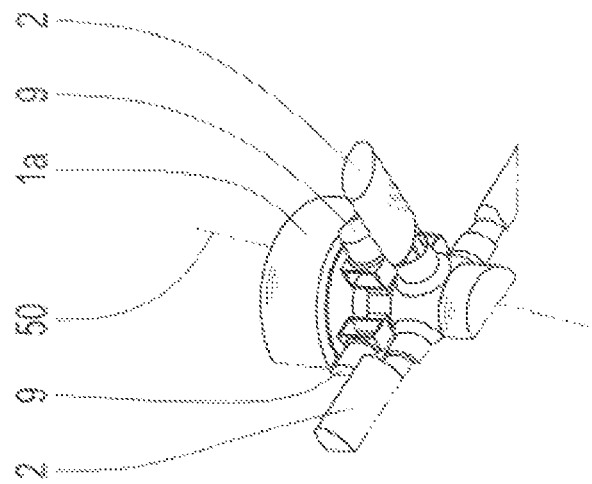
State-of-the Technology Fig. 2b
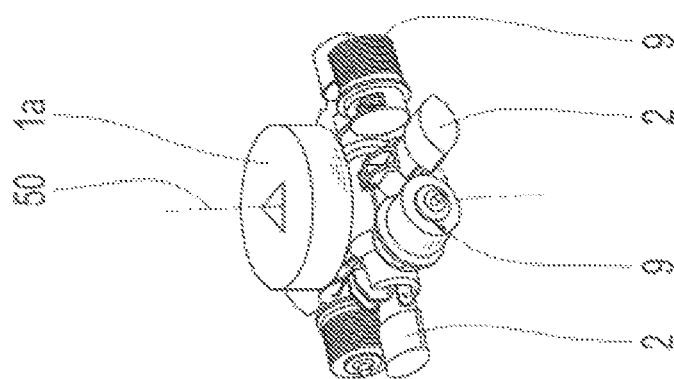
State-of-the Technology Fig. 2a

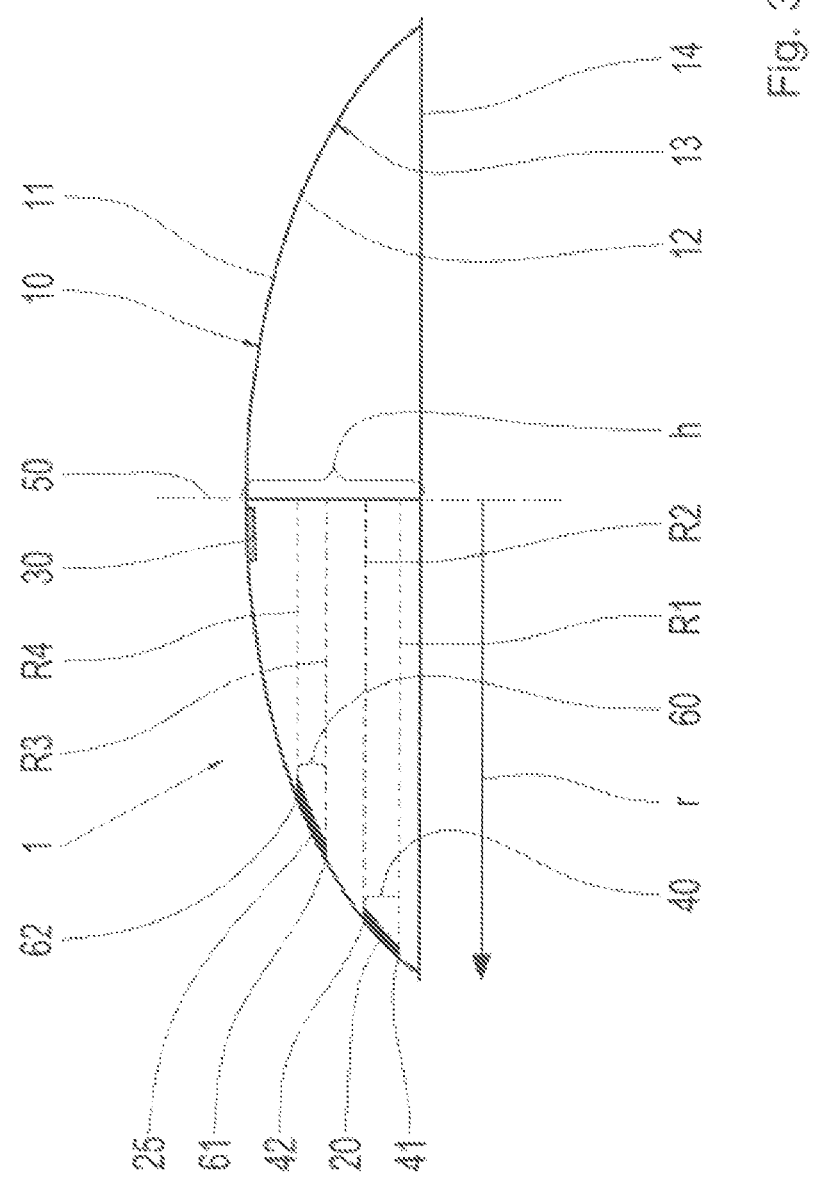

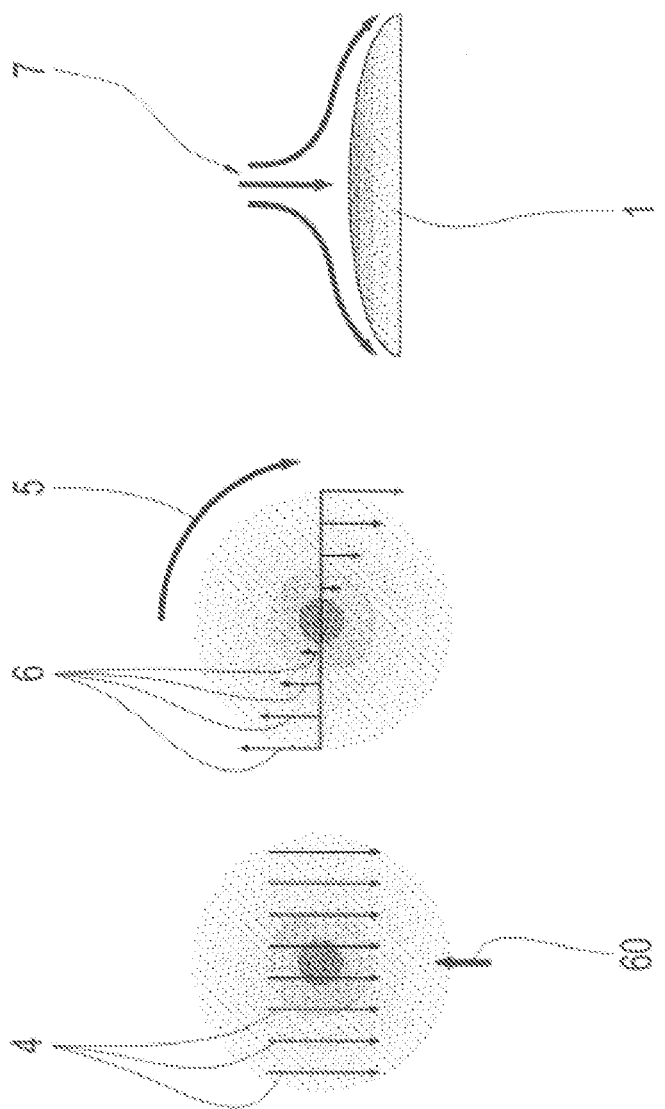

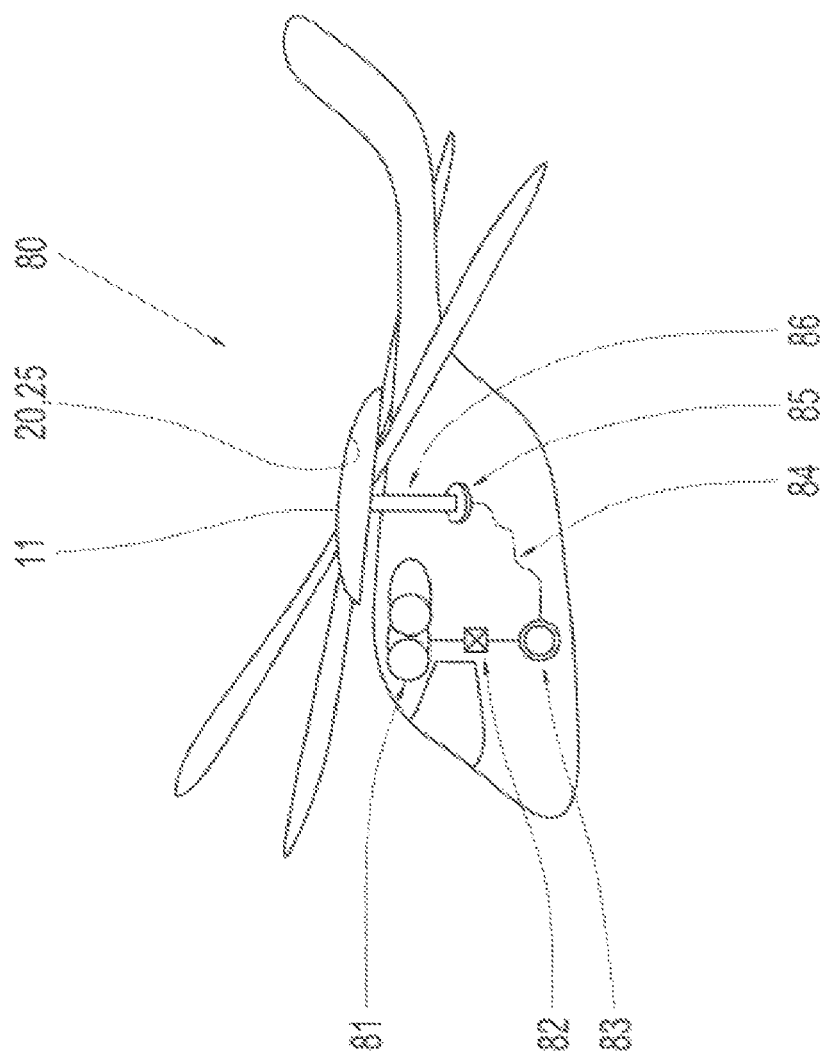

ROTOR HEAD WITH INTEGRATED ELECTRONICS FOR A HELICOPTER

RELATED APPLICATIONS

This application claims the benefit and priority of German Patent Application DE 10 2015 225 098.9, filed Dec. 14, 2015, which is incorporated by reference herein in its entirety.

BACKGROUND

1. Technical Field

The discovery affects a rotor hub cover for a helicopter according to the general term of claim 1.

A helicopter's rotor blades are mechanically attached to a rotor hub and connected to a rotor mast. The rotor mast turns the rotor hub and thereby the rotor blades. Aerodynamic losses at the rotor hub represent a significant proportion of the air resistance of the entire helicopter. In addition to impairing the flight performance and flight properties, aerodynamically poorly constructed rotor hubs can also lead to increased vibrations, whereby the tail rotor in particular can be negatively affected by air turbulence. Great value is therefore placed on the optimization of the aerodynamic design of modern helicopters' main rotors.

2. Background Information

Arranging rotor hubs in an aerodynamically non-resistant manner is based on U.S. Pat. No. 3,056,456, 3,217,811, 5,156,527 and 7,510,377.

In addition, the use of electrically motivated rotor components such as: pitch hinges, push rods or active systems for minimizing vibrations; is known; such components include equipment arranged as a rule between electrical power supplies and loads for controlling, switching and regulating electrical energy. This equipment includes performance parts, meaning performance electrical components and control and regulation parts, meaning electrical control components as well as potential additional equipment. For example, circuit boards are used as the mounts for the electronic components. Experts are familiar with integrated circuit technology (ICT) and the functional manner of circuit boards, so that further explanations can be avoided regarding them.

These electrical control and performance electronic components are exceptionally complex. For a variety of reasons, it may be necessary or desirable to arrange these components, at least in part, on the helicopter's rotor hub inside of a rotor hub cover. These reasons include, for example, signal transmission from the rotor hub subject to disruptions to the helicopter's body or high losses of performance over long stretches of cable between performance electronic packages, meaning the electrical performance components and the electrically driven rotor components.

According to the state-of-the-technology, housing for control and performance electronics components on a rotor mast have a cylindrical or drum-shaped geometry. One major disadvantage of these cylindrical covers lies in the high aerodynamic resistance in flight operation. In addition, the control and performance electronic components must frequently be cooled by means of cooling systems containing gaseous, liquid or solid materials or mixtures appropriate for removing heat that are expensive both in terms of construction and cost.

BRIEF SUMMARY

The principle task of the discovery will be the provision of a rotor hub cover with improved integration of electronic components, in particular control and performance electronic components, for a helicopter's rotor hub. Providing a rotor hub cover with a cooling system that will be: mechanically simple, as efficient as possible, exceptionally reliable and inexpensive; is another task for the discovery.

In accordance with the discovery, these tasks will be resolved by arranging the performance and control electronic components on one surface of the inside of the dome-shaped cover. The rotor hub cover is an aerodynamically non-resistant housing that can be executed as a hub cap or a part of a housing, for example.

In addition, the rotor hub cover will represent a housing that provide protection against environmental affects like moisture, dust and so on.

The rotor hub cover will also represent an axial end of a rotor mast. The shape of the rotor hub cover will be rotationally symmetrical, meaning that the shape of the cover and the base will be a rotationally symmetrical body. The rotational body may either be a spherical section or segment, for example. A spherical section is a part of the sphere that is formed by a cut with one layer. The spherical section has the form of a dome with one height and has a circular section as a surface with a radius of r. The fact that additional rotational bodies, which are aerodynamically advantageous, can be imagined for the rotor hub cover is clear to the expert.

The performance electronic components will have power semiconductors, which can be executed as MosFET or IGBT, for example. Power semiconductors are frequently connected to an H-bridge or a B6-bridge. The various connections variants for performance electronics will be known to the expert.

It was discovered that the arrangement of the performance and control electronic components according to the discovery made aerodynamically efficient mechanically integration on the rotor hub possible, while removing the need for active cooling units for these components.

In contrast to the state-of-the-technology according to which coolants has to be transferred from an stable system, such as the helicopter's body, to a rotating system, such as the rotor hub, by means of a rotational transfer system, the necessary cooling performance is already provided by the air flowing over the rotor hub cover through the rotation of the rotors. The flow of air has an additional cooling effect during flight. The downwash from the rotors also has a cooling effect. In aeronautics, downwash means a downward wind that is generated by the helicopter's rotating rotor blades and can be clearly perceived when starting and landing. The three types of airflow can be also designated as environmental air either in combination or individually over the course of this application.

Thereby, the use of cooling fins and similar devices can be avoided. On the one hand, this is a major advantage, because liquid-cooled cooling systems are exceptionally troublesome to design for applications relevant to safety, because they are subject to very high requirements for reliability. As a rule, the cooling systems are specifically subject to the same, similar, requirements as the components to be cooled. The minimal air resistance represents an additional advantage. The fact that collections of corrosive and/or volatile liquids, dust and/or blockages by foreign bodies can be prevented is yet another advantage, which makes continuous permanent cooling performance possible at a high degree of reliability. This is of major significance in particular for systems relevant for safety, such as electrical primary control systems.

Arranging the performance and control electronic components on circuit boards is preferred. In particular, circuit boards can be constructed as rigid circuit boards, rigid-flex circuit boards or flexible circuit boards. There is a preference for connecting the individual circuit boards using board-to-board connectors, cables or by means of rigid-flex circuit boards. Rigid-flex circuit boards consist of a combination of rigid and flexible circuit boards that are inextricably connected to each other. The dynamic and mechanical load-bearing capacity can be advantageously increased thereby, because centrifugal forces up to 200 g may be caused by the rotation of the rotors depending on the rotational speed and housing diameter. In addition, the freedom to design in a three-dimensional manner enabled thereby simplifies installation, saves rooms and retains uniform electrical characteristics.

Furthermore, it is preferable when at least one component of the performance and/or of the control electronic components is supported by, or fastened to, the rotor hub cover. Preferably, the components that have higher mass can be supported by, or fastened to, the rotor hub cover. To this end, the rotor hub cover can have corresponding recesses in order to support the components on the housing wall or integrate them with it. Components include, for example, capacitors and chokes. Performance electronic components may, for example, have larger capacitors as buffers and larger chokes as filters. By supporting them on the housing wall or fastening them to the housing wall, the load on the connection between the components and the circuit boards caused by high centrifugal forces and high vibrations can be reduced.

Furthermore, it is preferable that the performance electronic components are placed external in relation to the rotationally symmetric surfaces of the rotor hub cover, meaning that they have a larger distance from the axis of rotation than the control electronic components. The components arranged outwards on the surface of the rotor hub cover will experience better cooling performance than the components arranged inwards due to the faster circumferential speed.

It is especially preferable that the performance electronic components be arranged in the direction of rotation in the initial rotational zone, whereby the initial rotational zone is an initially curved part of the surface of the inner side with an initially lower end and an initially upper end, whereby the initially lower end has an initial radial distance and the initially upper end has a secondary radial distance to a rotational axis and that the control electronic components be arranged in the direction of rotation of a secondary rotational zone whereby the secondary rotational zone is a secondary curved part of the surface of the inner side with a secondary lower end and a secondary upper end, whereby the secondary lower end has a tertiary radial distance and the secondary upper end has a quaternary radial distance to the rotational axis, whereby the relation is $R1>R2>R3>R4$.

For the view of the rotational zone or rotation disc, one part of a spherical body should be understood as a sphere or spherical section that is sectioned off from two parallel layers. The curved surface area of the rotational zone or rotational disc is the rotational zone, for example a spherical zone.

The circuit boards for the performance electronic components normally have a larger performance loss than the circuit boards for the control electronic components.

For that reason circuit boards for the performance electronic components should be arranged where the circumferential speed of the rotor hub cover will be the highest, meaning at the furthest radial distance from the rotational axis. The circuit boards for the control electronic components will generate less thermal discharge and can be closer to the radial rotational center. Additional components, such as EMC filter and similar components, can be arranged so that they will be oriented on the radial direction of the rotational axis.

This will result in a preferable arrangement of EMC filters, control and performance electronic components depending on their radial distance to the rotational axis of one radial internal area over a radial average area to a radial external area, whereby the EMC filter(s) will be arranged in the radial internal area, the control electronic components in the radial middle area and the performance electronic components in the radial external area.

It was discover that the cooling performance by means of environmental are can be further increased through this preferred arrangement.

The arrangement of the control and performance electronic components in the direction of rotation on the inside of the dome-shaped cover makes cooling the individual components easier, because the inner side of the dome-shaped cover will be directly cooled by air flow from the environmental air in contrast with the external side and the heat thereby from the inner side can be directed to the external side of the dome, where it will be exhausted into the air.

In order to achieve the best possible distribution of heat and/or avoid so-called "hot-spots", it is preferable that the performance circuit boards be arranged on the surface of the inner side of the dome-shaped cover in the direction of rotation, that the second part of the performance circuit boards have a distance of $R5$ to a rotational axis and a part of the performance circuit board have a distance of $R6$ to a rotational axis, meaning that they will be arranged in a ratio of 2:1, where $R5$ is larger than $R6$. More performance losses will be arranged proportionally towards the radial outside, ensuring ideal cooling.

It is also preferable that the circuit boards be constructed in the shape of a trapezoid for the arrangement of the components for the performance electronic components. When the performance circuit boards have been arranged in the 2:1 ratio explained above and have been constructed in the shape of a trapezoid proved itself particularly advantageous.

In an additional preferred execution, the control electronic components will be arranged in the direction of rotation in the secondary rotational zone such that the respective surfaces of the control electronic components form one surface in the shape of one or more circular segments. Thus, the strongly limited area can be used ideally.

To design the heat exchange more efficiently, it is also preferable that the rotor hub cover be made of aluminum, at least in part, or heat-conducting composites or other thermally conductive materials, meaning that the dome-shaped cover be made of a thermally conductive material, in particular aluminum or thermally conductive composites, at least in the area of the performance electronic components. The term "in the area of performance electronic components" means a dome-shaped zone, in particular a spherical zone, that has a surface on the outside of the dome-shaped cover in the direction of rotation, which faces the respective surfaces on the inside of the dome-shaped cover where the performance electronic components have been arranged.

To achieve an ideal, meaning maximum, cooling effect, it is also preferable that the rotor hub cover be made entirely of aluminum or thermally conductive composites and has an electrically conductive environment and/or corrosion protection. An electrically conductive rotor hub cover that also screens against electromagnetic radiation both internally and externally is also advantageous. The electrically conductive environment and/or corrosion protection will ensure that disruptions can flow away from the rotor hub cover made of aluminum or composites over an impact edge of the individual components. To ensure an ideal electromagnetic screen and ideal protection against environmental effects, such as moisture for example, it is also preferable that conductive seals be used between the individual components of the rotor hub cover.

Furthermore, it is preferable that the rotor hub cover has at least N areas that are electrically, thermally and mechanically insulated from each other, whereby one respective area will have at least the performance and control electronic components, where N is equal to or greater than a natural number.

Furthermore, it is preferable when neighboring areas have been thermally insulated from each other by means of barriers and that neighboring thermal barriers span a angle of φ equal to 360/M, where M equals N.

Systems in the flight vehicles relevant to safety should be built redundantly.

As criticality increases, the requirements on insulating the redundant sections from each other increases. A triplex system has proven to be particularly advantageous where the rotor hub cover should be divided into three areas insulated from each other. Area should be understood in this context as a volume that respectively includes one part of the redundantly built performance and control electronics and can also include also one part of the EMC filter unit. These two or three components are collected in so-called "lanes".

The mechanical insulation into three volumes ensures, for example, that components that have been released from their fastenings by vibration will cause damage to other lanes. The thermal insulation ensures that overheating in one lane cannot cause damage in another lane. The individual volumes can be insulated from each other by means of barriers with high thermal resistances to thermally disconnect the lanes. It is preferable that the thermal insulation occurs by means of composite materials, glass or air & vacuum.

If a quadruplex architecture is required for the fulfillment of the required reliability, the described morphology can also be extended to a quadruplex system with four insulated volumes.

It is also preferable when the thermal insulation occurs by means of composite materials, glass or air & vacuum.

BRIEF DESCRIPTION OF THE DRAWINGS

Additional advantages will result from the descriptive figures found hereafter. The figures, the descriptive figures and the claims will contain combinations of numerous characteristics. Experts will also consider the characteristics individually according to the intended purpose and collectively in further reasonable combinations.

FIG. 1 is an initial rotor hub cover according to the state-of-the-technology.

FIG. 2a is a second rotor hub cover according to the state-of-the-technology.

FIG. 2b is an third rotor hub cover according to the state-of-the-technology.

FIG. 3 is a cross-section of a rotor hub cover according to the discovery as a prototype.

FIG. 4 is three types of air flow in schematic views.

FIG. 5 is a schematic view of a sample power supply for a helicopter with a rotor hub cover according to FIG. 3.

DETAILED DESCRIPTION OF THE DRAWINGS AND THE PRESENTLY PREFERRED EMBODIMENTS

Figure 6:
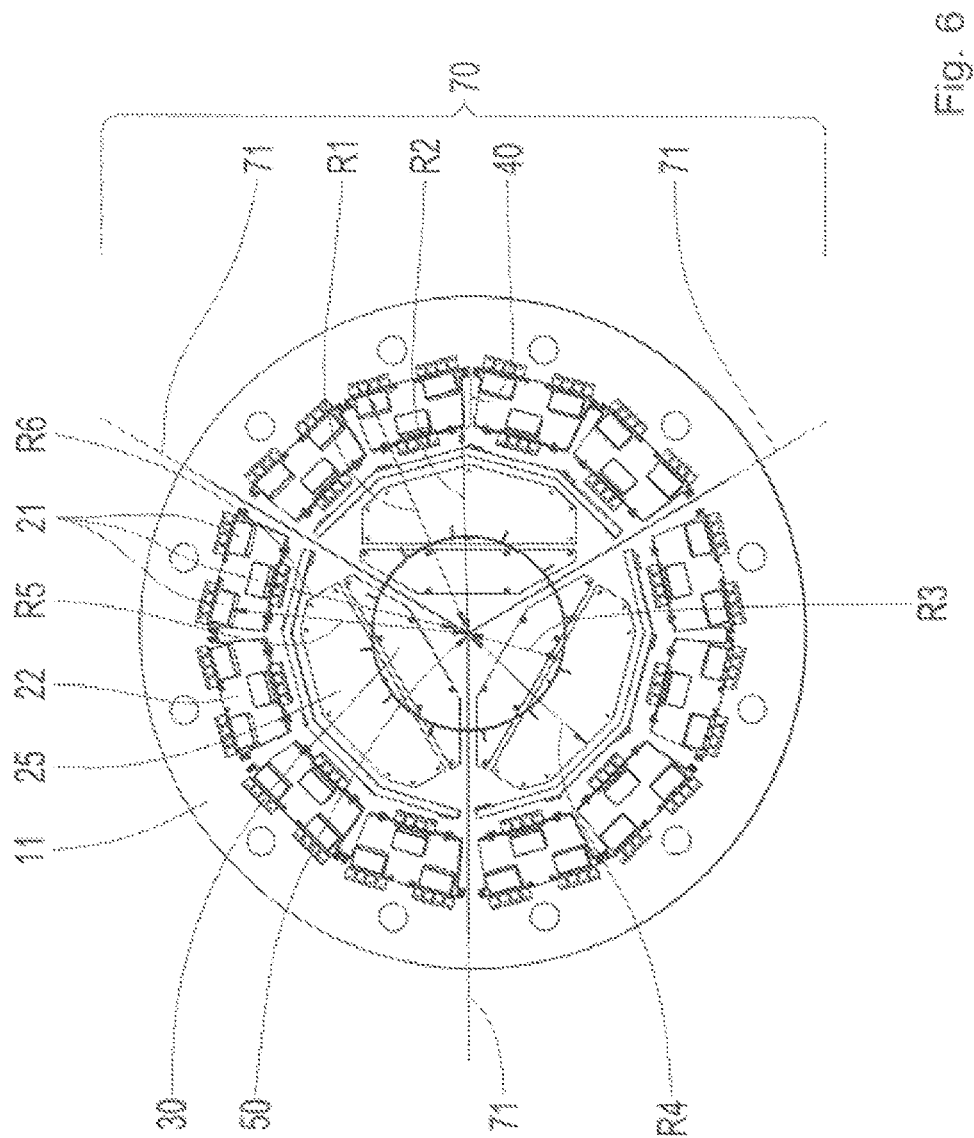
FIG. 6 is a top view of a rotor hub cover in accordance with the discovery in an additional preferred execution.

FIGS. 1, 2a and 2b show 1a cylindrical rotor hub covers according to the state-of-the-technology. The state of the technology according to FIG. 1 has a drum-shaped geometry, meaning that the height is significantly taller than the diameter. FIGS. 2a and 2b show the state of the technology with a slightly improved rotor hub cover for a planar (2a) and co-planar (2b) arrangement of the actuators (9) with regard to their position relative to the rotor blades (2). These cylinder forms do make even cooling of all circuit boards possible; however among other things, they cause significantly higher air resistance, are maintenance intensive and complex.

In contrast with the state of the technology, FIG. 3 shows a rotor hub cover (1) according to the discovery in prototype form. The rotor hub cover (10), made of aluminum or thermally conductive composites, includes a rotational body (10) that has been constructed as a spherical cap (11) and can rotate around a rotational axis (50). The spherical cap (11) has a height of h and a radius of r, which defines a rotationally symmetric surface (14) constructed as a circular section.

Performance electronic components (20) with circuit boards (21) constructed using MosFET, control electronic components (25) and EMC filter (30) have been arranged along a surface (12) on the internal side (13) of the spherical cap (11). In this, the components 20, 25 and 30 have been arranged such that they have been arranged according to the size of their performance loss from the radial outside to the radial inside. Radial outside and inside are related to each other on the radius of r.

Thus, the performance electronic components (20) that have a higher performance loss than the control electronic components (25) and the EMC filter (30) have been arranged in the initial rotation zone (40). Rotation Zone 40 runs along the circumference of the spherical cap (11) and is limited along the x-axis of the rotational axis (50) by an initial lower end (41) and an initial upper end (42).

The lower end (41) has a radius of R1 and the upper end (42), a radius of R2 to the rotational axis (50). The performance electronic components (20) have been arranged by means of rigid-flex circuit boards (22). They have a degree of curvature similar to, or the same as, the spherical cap (11) in the area of the initial rotation zone (40).

The control electronic components (25) that have a lower performance loss than the performance electronic components (20) and thereby cause less thermal discharge have been arranged in a secondary rotation zone (60) and thereby are nearer to the rotational axis (50) than the performance electronic components (20). Rotation Zone 60 runs along the circumference of the spherical cap (11) and is limited along the x-axis of the rotational axis (50) by a secondary lower end (61) and a secondary upper end (62). The lower end (61) has a radius of 31 and the upper end (62), a radius of R4 to the rotational axis (50). The performance electronic components (25) have also been arranged by means of rigid-flex circuit boards (22). Thereby, the relation is R1>R2>R3>R4.

The EMC filter (30) is closer to the rotational axis (50).

Cooling fins are not necessary for high cooling performance for the thermal placement depicted in FIG. 3, because the components with higher performance loss have been integrated correspondingly further outside along the radius. Similarly, the cooling performance has been positively affected by the airflow relationships. The air flow surrounding the spherical cap (11) essentially results from Air Flow Pattern 4 indexed by the forward motion (3) of the helicopter (FIG. 4, left image), from the circumferential speed (6) indexed by means of the rotation of the main rotor rotating in direction (5) and thereby the spherical cap (11) itself (FIG. 4, center image) and by the air flow (7) indexed by the so-called "downwash" (FIG. 4., right image).

FIG. 5 shows a sample energy supply for a helicopter (80) with the rotor hub cover (1) constructed using the spherical cap (11) according to the discovery. The helicopter (80) has one or more primary motors (81). The primary motor (81) is connected with one or more generators (83) using a mechanical drive train (82). The generator (83) converts the mechanical energy of the primary motor (81) into electrical energy. The electrical energy is transferred through a corresponding cabling (84) to a rotational transfer system (85), such as a slip or roll ring. The electrical energy is transferred from the helicopter's body (80) to the rotating system through the rotational transfer system (85).

The cables (84) is conducted from the initial side of the rotational transfer system (84) inside of the rotor mast (86) to a connection constructed as a plug-and-socket connection or plug terminals (87) (FIG. 87) for connection to the performance and control electronics (20, 25) inside of the spherical cap.

Figure 7:
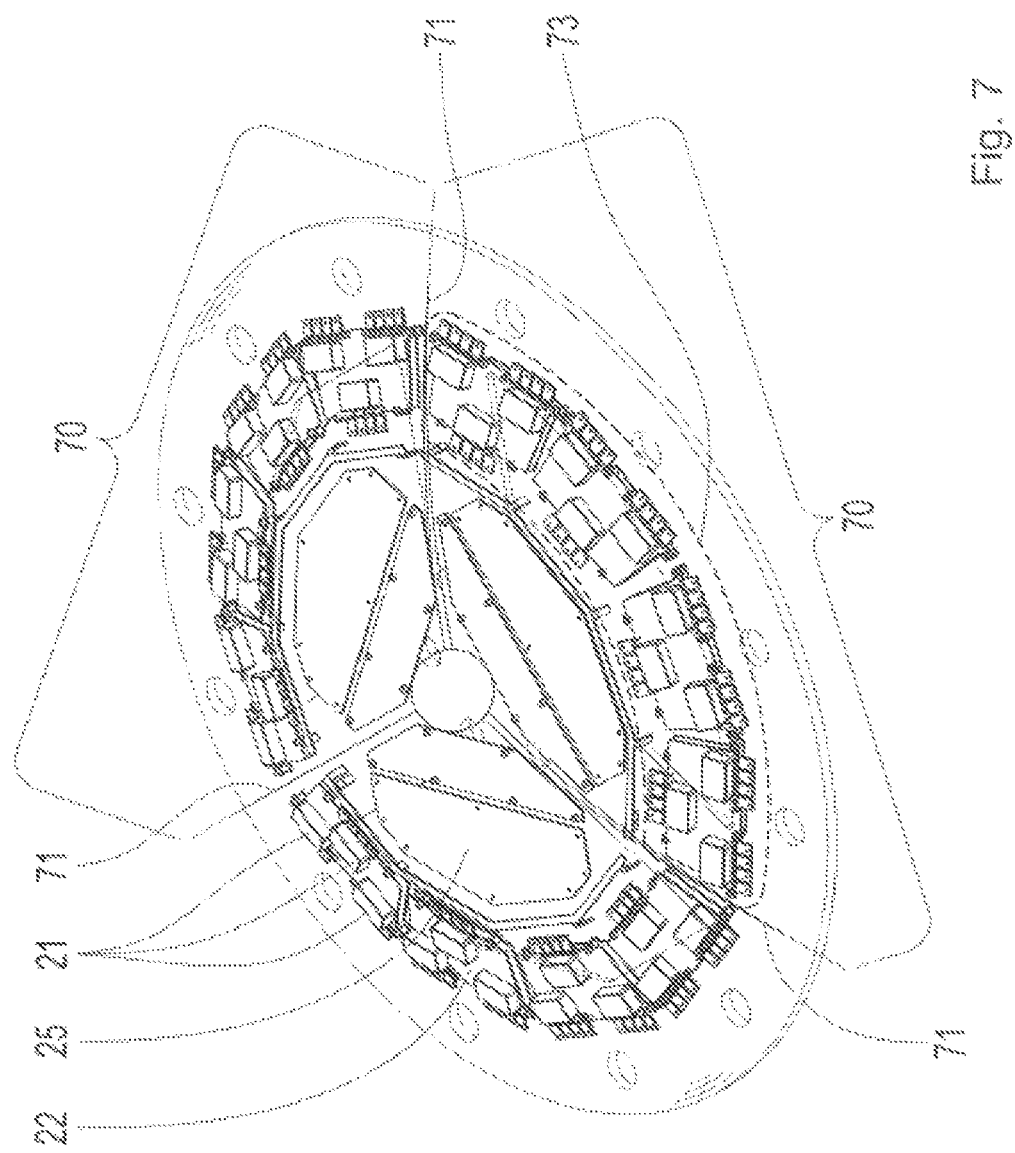
FIG. 7 is a perspective view of the rotor hub cover from FIG. 6.

FIG. 6 shows a schematic diagram of another preferred execution and a top view of the individual components. The spherical cap (11) has been divided into three areas (70), or volumes, insulated from each other by means of barriers (71). Each area (70) includes a part of the redundantly constructed performance and control electronics (20, 25), a so-called "lane" (73) (FIG. 7). The mechanical insulation into three volumes (70) ensures, for example, that components that have been released from their fastenings by vibration will cause damage to other lanes (73). The arrangement shown in FIG. 6 with the mechanical and thermal insulation in three areas (70) is also called a triplex system.

The three volumes (70) have been insulated from each other by means of barriers (71) and thereby form lanes (73). The barrier (71) also has additional air-vacuum chambers for this. Composite materials, glass or similar materials can also be used for thermal disconnection.

The performance circuit boards (23) are carried on circuit boards (22) and mounted in the rotation zone (40). It should be noted that a volume (70) has a certain number of circuit boards and that ⅔ of the circuit boards have a radius of R5 and ⅓ of the circuit boards have a radius of R6 to the rotational axis (50) with R5 being greater than R6. This corresponds to a ratio of 2 to 1.

An improved cooling performance can be achieved thereby and hot-spots avoided. Naturally, other ratios can be conceived as long as a multiple of the circuit boards have a greater radius to the rotational axis (50). It is possible that Radius R1, which defines the lower end (41) of the rotational zone (40), coincides with the Radius R5. In addition, it is possible that Radius R2, which defines the lower end (42) of the rotational zone (40), coincides with the Radius R6.

FIG. 7 shows an additional view of the spherical cap (11).

Figure 8:
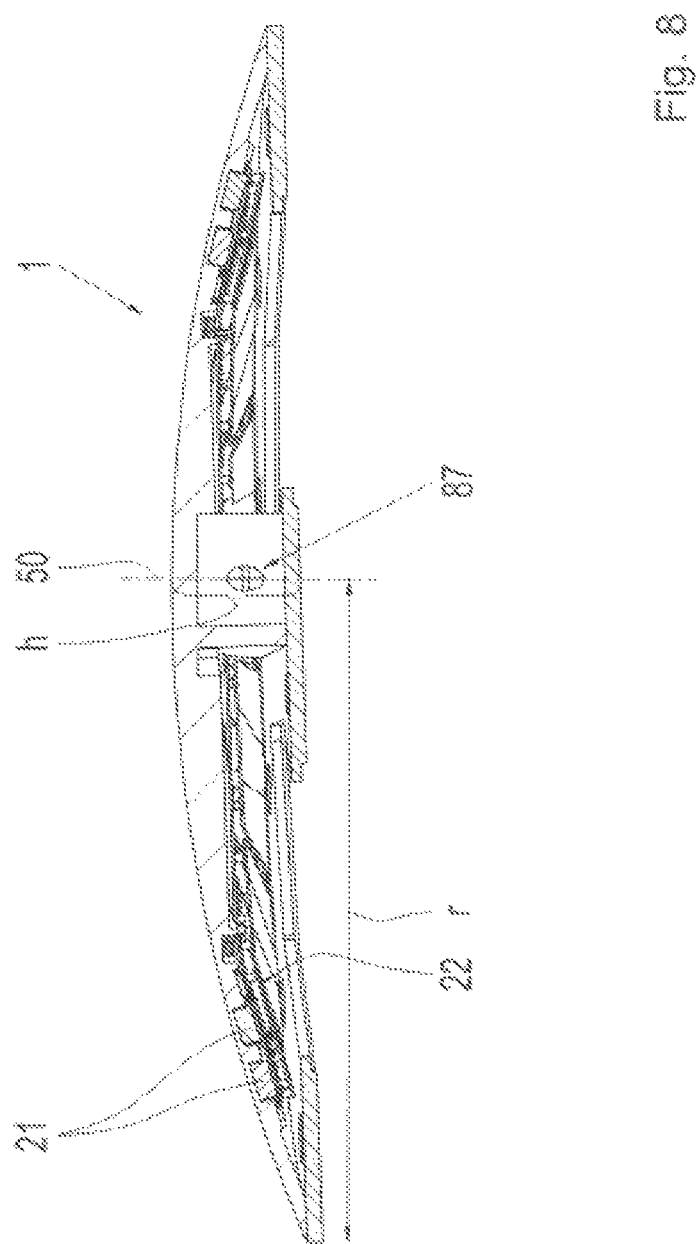
FIG. 8 is an additional view of the rotor hub cover from FIG. 6.

FIG. 8 shows a cross-section of the spherical cap (11). It should be noted that the MosFET (21) have been arranged between the surface (12) of the internal side (13) of the spherical cap (11) and the rigid-flex circuit boards (22). The performance and control electronic components (20, 25) can be connected to the energy sources by means of the plug-and-socket connections (87) detectable through a hole.

Figure 9:
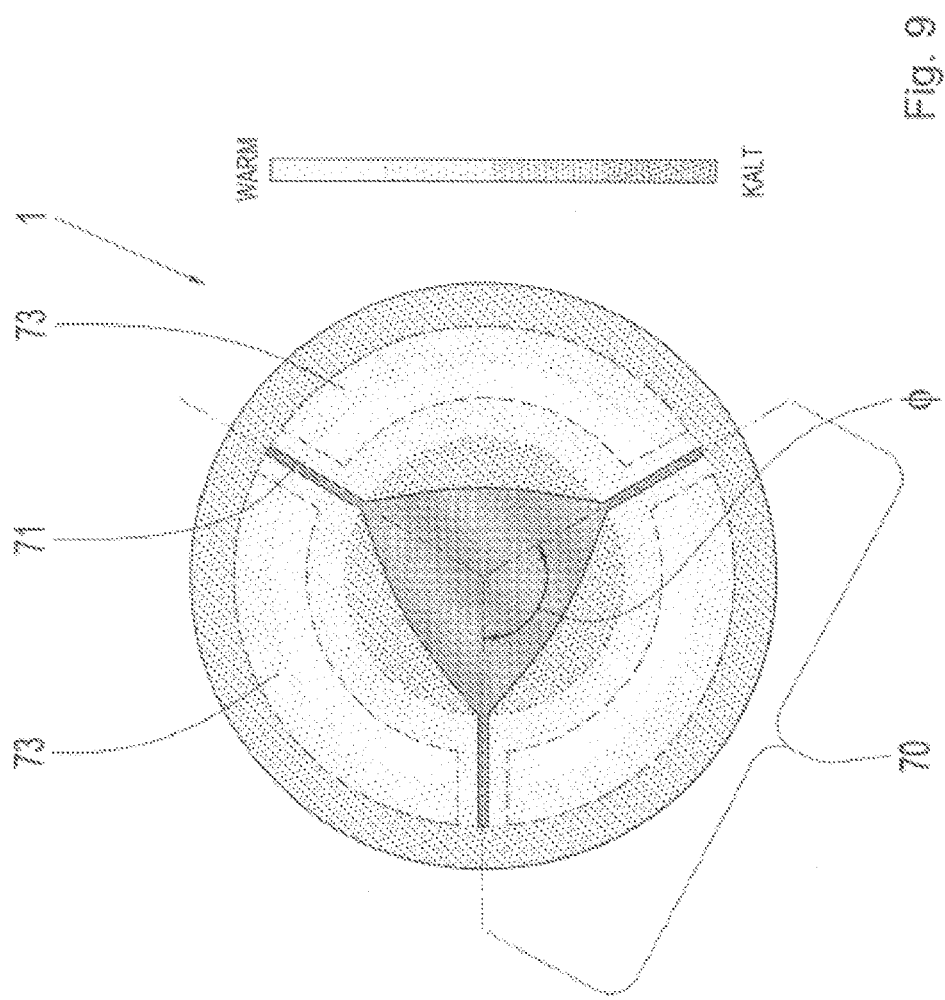
FIG. 9 is a top view of schematic temperature distribution for the rotor hub cover from FIG. 6.

FIG. 9 shows a schematic temperature distribution for a thermally insulated triplex system according to the preferred execution according to FIG. 6. The performance loss, thus heat generating lanes (73) (depicted brightly), that include performance electronic components (20) as well as control electronic components (25), have been thermally insulated from each other by means of the air-vacuum barriers (71) (depicted darkly). The areas (70) have been preferably sized the same in a triplex system so that neighboring barriers (71) span an angle Φ equaling 120°.

Figure 10:
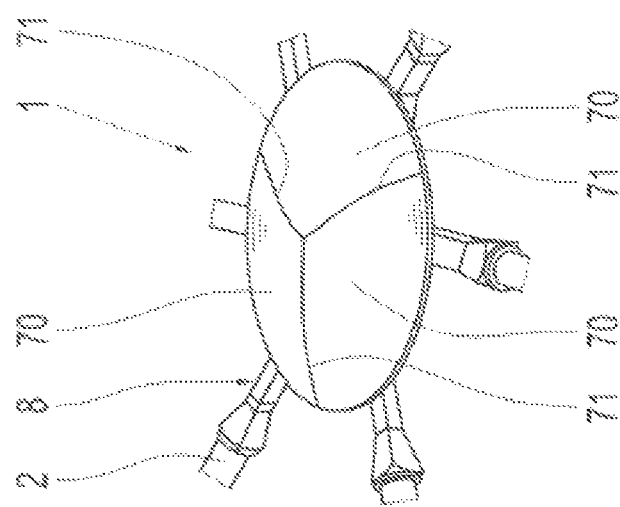
FIG. 10 is an additional perspective view of the rotor hub cover from FIG. 6.

FIG. 10 shows the rotor hub cover from FIG. 3 for a helicopter with integrated control systems, which implement primary control as well as independent blade control functions using independent blade control components (8) on the rotor hub. This enables the design of fly-by-wire helicopter controls without swash plates. Furthermore, vibrations, a helicopter's control loads, noises and rotor performance needs can be significantly reduced thereby.

LEGEND

1 Rotor hub cover
1a Rotor hub cover according to the state of the technology
2 Rotor blade
3 The helicopter's direction of flight
4 Air flow through forward motion
5 Direction of rotor rotation
6 Circumferential speed
7 Downwash
8 Individual blade control components
9 Actuators
10 Rotational bodies
11 Dome-shaped cover, spherical cap
12 Internal surface of the spherical cover
13 Internal side of the spherical cover, internal side of the spherical cap
14 Rotationally symmetric surfaces, circular section
20 Performance electronics, performance electronic components
21 Circuit boards, MosFET
22 Rigid-flex circuit boards, circuit boards, PCBs
25 Control electronics, control electronic components
30 Filter unit, EMC filter
40 Initial rotational body zone, initial spherical zone
41 Initial lower end of the initial spherical zone
42 Initial upper end of the initial spherical zone
50 Rotational axis of the rotor hub cover
60 Secondary rotational body zone, secondary spherical zone
61 Secondary lower end of the secondary rotational body zone
61 Secondary upper end of the secondary rotational body zone
70 Area
71 Mechanical barriers, thermal barriers 73 Lane
80 Helicopter
81 Primary motor(s)
82 Mechanical drive train
83 Generator(s)
84 Cabling
85 Rotational transfer system, slip ring, roll ring
86 Rotor mast
87 Connection, plug terminal, plug-and-socket connection
N Natural number greater than two
h Height of the spherical cover
r Radius of the rotationally symmetric surface
R1 First radius
R2 Second radius
R3 Third radius
R4 Fourth radius
R5 Fifth radius
R6 Sixth radius
$\Phi$ Angle spanned by neighboring areas (70)

What is claimed is:

1. A rotor hub cover for a helicopter, the rotor hub cover comprising:
   a rotational body with a dome-shaped cover;
   a plurality of performance electronic components; and
   a plurality of control electronic components;
   wherein the performance electronic components and the control electronic components are arranged on a surface of an internal side of the dome-shaped cover.

2. The rotor hub cover of claim 1, wherein the performance electronic components are arranged on circuit boards.

3. The rotor hub cover of claim 1, wherein at least one of the performance electronic components and/or at least one of the control electronic components is supported by the rotor hub cover.

4. The rotor hub cover of claim 1, wherein the performance electronic components are positioned radially externally in relation to the rotationally symmetric surfaces of the rotor hub cover such that the performance electronic components have a larger distance from an axis of rotation than the control electronic components.

5. The rotor hub cover of claim 1, wherein the performance electronic components are arranged in the direction of rotation of an initial rotational zone;
   wherein the initial rotational zone comprises an initially curved part of the surface of the internal side with an initially lower end and an initially upper end;
   wherein the initially lower end has an initial radial distance and the initially upper end has a secondary radial distance to a rotational axis;
   wherein the control electronic components are arranged in the direction of rotation of a secondary rotational zone;
   wherein the secondary rotational zone is a secondary curved part of the surface of the internal side with a secondary lower end and a secondary upper end;
   wherein the secondary lower end has a tertiary radial distance and the secondary upper end has a quaternary radial distance to the rotational axis; and
   wherein the initial radial distance is greater than the secondary radial distance, the secondary radial distance is greater than the tertiary radial distance, and the tertiary radial distance is greater than quaternary radial distance.

6. The rotor hub cover of claim 2, wherein the circuit boards for the performance electronic components are arranged in the direction of rotation on the surface of the internal side so that two parts of the circuit boards have a first distance to a rotational axis and one part of the circuit boards has a second distance to the rotational axis; wherein the first distance is greater than the second distance.

7. The rotor hub cover of claim 2, wherein the circuit boards are constructed in the shape of a trapezoid to arrange the performance electronic components.

8. The rotor hub cover of claim 1, wherein the control electronic components are arranged such that respective surfaces of the control electronic components form on surface in the shape of one or more circular segments.

9. The rotor hub cover of claim 1, wherein the rotor hub cover is formed at least partially from aluminum or thermally conductive composites.

10. The rotor hub cover of claim 1, wherein the rotor hub cover is formed at least partially from aluminum or thermally conductive composites and has an electrically conductive environmental and corrosion protection.

11. The rotor hub cover of claim 1, wherein conductive seals are used between individual components of the rotor hub cover.

12. The rotor hub cover of claim 1, wherein the rotor hub cover also comprises one or more areas that are electrically, thermally and mechanically insulated from each other; and
   wherein one area comprises performance and control electronic components.

13. The rotor hub cover of claim 12, wherein adjacent areas are thermally insulated from each other by barriers; and where the barriers span an angle that is equal to 360 divided by the number of areas.

14. The rotor hub cover of claim 12, wherein the barriers for thermal insulation comprise composite materials, glass or air-vacuum.

15. The rotor hub cover of claim 2, wherein at least one of the performance electronic components and/or at least one of the control electronic components is supported by the rotor hub cover.

16. The rotor hub cover of claim 2, wherein the performance electronic components are positioned radially externally in relation to the rotationally symmetric surfaces of the rotor hub cover such that the performance electronic components have a larger distance from an axis of rotation than the control electronic components.

17. The rotor hub cover of claim 2, wherein the performance electronic components are arranged in the direction of rotation of an initial rotational zone;
   wherein the initial rotational zone comprises an initially curved part of the surface of the internal side with an initially lower end and an initially upper end;
   wherein the initially lower end has an initial radial distance and the initially upper end has a secondary radial distance to a rotational axis;
   wherein the control electronic components are arranged in the direction of rotation of a secondary rotational zone;
   wherein the secondary rotational zone is a secondary curved part of the surface of the internal side with a secondary lower end and a secondary upper end;
   wherein the secondary lower end has a tertiary radial distance and the secondary upper end has a quaternary radial distance to the rotational axis; and
   wherein the initial radial distance is greater than the secondary radial distance, the secondary radial distance is greater than the tertiary radial distance, and the tertiary radial distance is greater than quaternary radial distance.

18. The rotor hub cover of claim 15, wherein the circuit boards are constructed in the shape of a trapezoid to arrange the performance electronic components.

19. The rotor hub cover of claim 2, wherein the control electronic components are arranged such that respective surfaces of the control electronic components form on surface in the shape of one or more circular segments.

20. The rotor hub cover of claim 2, wherein the rotor hub cover is formed at least partially from aluminum or thermally conductive composites.

* * * * *